(12) United States Patent
Etter et al.

(10) Patent No.: US 7,728,578 B2
(45) Date of Patent: Jun. 1, 2010

(54) METHOD AND APPARATUS FOR HIGH CURRENT MEASUREMENT

(75) Inventors: Brett E. Etter, Austin, TX (US); Donald E. Alfano, Round Rock, TX (US); Timothy J. Dupuis, Austin, TX (US); Donald K. Coffey, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 27 days.

(21) Appl. No.: 12/121,024

(22) Filed: May 15, 2008

(65) Prior Publication Data

US 2009/0284248 A1    Nov. 19, 2009

(51) Int. Cl.
*G01R 33/00* (2006.01)

(52) U.S. Cl. .................. 324/126; 324/117 R; 324/96; 324/127

(58) Field of Classification Search .................. None
See application file for complete search history.

(56) References Cited

U.S. PATENT DOCUMENTS

| | | | |
|---|---|---|---|
| 4,176,374 A | 11/1979 | Eames | |
| 4,240,059 A | 12/1980 | Wolf et al. | |
| 4,536,706 A | 8/1985 | Kemper | |
| 4,691,338 A | 9/1987 | Makino | |
| 4,926,116 A * | 5/1990 | Talisa | 324/117 R |
| 4,931,725 A | 6/1990 | Hutt et al. | |
| 4,939,541 A | 7/1990 | Sugiura | |
| 5,015,945 A | 5/1991 | Radun | |
| 5,032,785 A | 7/1991 | Mathis et al. | |
| 5,070,317 A | 12/1991 | Bhagat | |
| 5,124,648 A | 6/1992 | Webb et al. | |
| 5,128,611 A | 7/1992 | Konrad | |
| 5,478,773 A | 12/1995 | Dow et al. | |
| 5,696,441 A | 12/1997 | Mak et al. | |
| 5,717,327 A | 2/1998 | Bradford | |
| 5,815,391 A | 9/1998 | Pelly | |
| 5,952,704 A | 9/1999 | Yu et al. | |
| 5,963,038 A | 10/1999 | De Jong et al. | |
| 5,986,341 A | 11/1999 | Usami et al. | |

(Continued)

FOREIGN PATENT DOCUMENTS

EP      1498916      1/2005

(Continued)

OTHER PUBLICATIONS

"Magnetic Current Sensing," AN-209, Honeywell Solid State Electronics Center, Apr. 2000, 7 pages.

(Continued)

*Primary Examiner*—Minh N Tang
(74) *Attorney, Agent, or Firm*—Zagorin O'Brien Graham LLP

(57) ABSTRACT

In order to extend the measurement range of a current sensor, a current divider is formed by a first conductor formed in a current sensor that is mounted on a printed circuit board and a second conductor on the printed circuit board that electrically shorts at least one input terminal of the current sensor to at least one output terminal of the current sensor. The input terminal of the current sensor supplies the current to be measured to the first conductor and the output terminal supplies the measured current back to the printed circuit board.

18 Claims, 5 Drawing Sheets

U.S. PATENT DOCUMENTS

| | | | |
|---|---|---|---|
| 6,054,329 | A | 4/2000 | Burghartz et al. |
| 6,061,224 | A | 5/2000 | Allen |
| 6,069,397 | A | 5/2000 | Cornett et al. |
| 6,097,203 | A | 8/2000 | Parker et al. |
| 6,169,680 | B1 | 1/2001 | Matsui et al. |
| 6,271,655 | B1 | 8/2001 | Weber et al. |
| 6,274,920 | B1 | 8/2001 | Park et al. |
| 6,291,872 | B1 | 9/2001 | Wang et al. |
| 6,356,068 | B1 | 3/2002 | Steiner et al. |
| 6,384,478 | B1 | 5/2002 | Pour |
| 6,414,475 | B1 | 7/2002 | Dames et al. |
| 6,577,115 | B1 | 6/2003 | Carpenter |
| 6,608,361 | B2 | 8/2003 | Chang et al. |
| 6,661,231 | B1 | 12/2003 | Arai et al. |
| 6,781,359 | B2 | 8/2004 | Stauth et al. |
| 6,791,341 | B2 | 9/2004 | Shenai et al. |
| 6,828,770 | B1 | 12/2004 | McCauley et al. |
| 6,835,576 | B2 | 12/2004 | Matsuzaki et al. |
| 6,894,478 | B1 | 5/2005 | Fenske |
| 6,964,918 | B1 | 11/2005 | Fan et al. |
| 6,972,658 | B1 | 12/2005 | Findley et al. |
| 6,987,307 | B2 | 1/2006 | White et al. |
| 7,118,925 | B2 | 10/2006 | Brennan et al. |
| 7,196,397 | B2 | 3/2007 | Chiola et al. |
| 7,203,047 | B2 | 4/2007 | Holce et al. |
| 7,227,240 | B2 | 6/2007 | Knapp et al. |
| 7,239,123 | B2 | 7/2007 | Rannow et al. |
| 7,268,409 | B2 | 9/2007 | Tseng et al. |
| 7,292,400 | B2 | 11/2007 | Bishop |
| 7,362,086 | B2 | 4/2008 | Dupuis et al. |
| 7,397,234 | B2 | 7/2008 | Alfano et al. |
| 7,400,025 | B2 | 7/2008 | Pitts et al. |
| 7,453,142 | B2 | 11/2008 | Lee et al. |
| 2002/0105080 | A1 | 8/2002 | Speakman |
| 2003/0098505 | A1 | 5/2003 | Kimura et al. |
| 2004/0021218 | A1 | 2/2004 | Hayama et al. |
| 2004/0263148 | A1 | 12/2004 | Takabatake |
| 2005/0003562 | A1 | 1/2005 | Bhatt et al. |
| 2005/0007296 | A1 | 1/2005 | Endo et al. |
| 2005/0103112 | A1 | 5/2005 | Pedersen et al. |
| 2005/0134254 | A1* | 6/2005 | Roden et al. ............... 324/126 |
| 2005/0156587 | A1 | 7/2005 | Yakymyshyn et al. |
| 2005/0285262 | A1 | 12/2005 | Knapp et al. |
| 2006/0020371 | A1 | 1/2006 | Ham et al. |
| 2006/0038552 | A1 | 2/2006 | Omura et al. |
| 2006/0044088 | A1 | 3/2006 | Vaitkus et al. |
| 2006/0152323 | A1 | 7/2006 | Pavier |
| 2006/0181385 | A1 | 8/2006 | Hurley |
| 2007/0018298 | A1 | 1/2007 | Gamand |
| 2007/0072340 | A1 | 3/2007 | Sanzo et al. |
| 2007/0114651 | A1 | 5/2007 | Marimuthu et al. |
| 2007/0139032 | A1 | 6/2007 | Dupuis et al. |
| 2007/0139066 | A1 | 6/2007 | Dupuis et al. |
| 2007/0139835 | A1 | 6/2007 | Alfano et al. |
| 2008/0136399 | A1 | 6/2008 | Alfano et al. |
| 2008/0157272 | A1 | 7/2008 | Tanaka |
| 2009/0001962 | A1 | 1/2009 | Dupuis et al. |

FOREIGN PATENT DOCUMENTS

| | | |
|---|---|---|
| WO | 02082109 | 10/2002 |

OTHER PUBLICATIONS

ACS704 Data Sheet, Allegro MicroSystems, Inc., (date prior to Oct. 9, 2005 email listing reference) 2 pages.

ACS704ELC-015 Data Sheet, Allegro MicroSystems, Inc. Rev. 6, 2005, 19 pages.

Honeywell, "Battery Powered Current Sensor" Ask the Engineer, Honeywell Solid State Electronics Center, 2003, 1 page.

Friedrich, Andreas P., and Lemme, Helmuth, "The Universal Current Sensor," Sensors magazine, May 1, 2000, 12 pages.

Jalebi, Ehsan Abdi et al., Real Time Rotor Bar Current Measurements Using a Rogowski Coil Transmitted Using Wireless Technology, University of Cambridge White Paper, Aug. 9, 2003, 9 pages.

Jingsheng, Liao et al., "Studies of Rogowski Coil Current Transducer for Low Amplitude Current (100A) Measurement," IEEE CCECE 2003 Canadian Conference on Electrical and Computer Engineering, vol. 1, May 4-7, 2003, 5 pages.

Koon, William, "Current Sensing for Energy Metering," in Conference Proceedings IIC-China/ESC-China 2002, pp. 321-324.

Ward, D. A. and Exon, J. La T., "Using Rogowski Coils for Transient Current Measurements," Engineering Science and Education Journal, Jun. 1993, 9 pages.

Honeywell, "1- and 2-Axis Magnetic Sensors HMC1001/1002, HMC1021/1022," Honeywell Sensor Products Data Sheet, Rev. B, Apr. 2000, 17 pages.

Nakura, Toru, et al., University of Tokyo, Tokyo, Japan, "On-chip dI/dt Detector IP for Power Supply"; D & R Headline News, 2003, www.design-reuse.com, pp. 1-9.

* cited by examiner

METHOD AND APPARATUS FOR HIGH CURRENT MEASUREMENT

BACKGROUND

1. Field of the Invention

This invention relates to current sensors and more particularly to extending the current measurement range of current sensors.

2. Description of the Related Art

Various implementations of current sensors are used to measure high amperage AC current. For example, high amperage current may be measured using Rogowski coils surrounding the high amperage conductor. However, such approaches are not feasible in such applications where high amperage current, e.g., on the order of 100 A, is carried on traces on a printed circuit board. Accordingly, improved techniques for measuring high amperage current are desirable.

SUMMARY

Accordingly, in one embodiment, an apparatus is provided that includes a printed circuit board and a current sensor coupled to the printed circuit board, the current sensor including a first conductor portion to carry a first current to be measured by the current sensor. The apparatus includes a second conductor portion to carry a second current and the first conductor portion and the second conductor portion form a current divider to divide a third current. The current sensor includes one or more input terminals to receive the first current from the printed circuit board (PCB) and one or more output terminals to supply the first current to the PCB. The second conductor is electrically coupled to at least one of the one or more input terminals and at least one of the one or more output terminals to short the input and output terminals together.

In another embodiment, a method is provided for current measurement that includes dividing a first current in a current divider formed by a first conductor and a second conductor, the first conductor in a current sensor receiving current from at least one input terminal of the current sensor and supplying current to at least one output terminal of the current sensor, the second conductor electrically coupling the at least one input terminal and at least one output terminal of the current sensor. The current sensor measures a second current in the first conductor of the current sensor formed by the current division.

In another embodiment, an apparatus is provided that includes a current divider formed by a first conductor in a current sensor and a second conductor on a printed circuit board that electrically shorts at least one input terminal of the current sensor to at least one output terminal of the current sensor. The at least one input terminal of the current sensor is coupled to supply current to be measured to the first conductor and the at least one output terminal is coupled to supply the measured current from the first conductor back to the printed circuit board. In an embodiment, the current sensor includes an integrated circuit die and a package in which the first conductor is formed adjacent to the integrated circuit die. In an embodiment the first and second conductors are formed of a substantially similar conductive material, e.g., copper.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Current sensors may use a coupled inductor to sense the AC current in a circuit. The coupled inductor includes a conductor or metal slug through which current flows, and a second inductor fabricated on an integrated circuit, e.g., in a CMOS process, that is placed in close proximity to the slug. AC current flowing through the slug creates a field, which induces a voltage into the second inductor according to Ampere's law of induction (i.e., $v=Ldi/dt$). This voltage signal is processed by circuits fabricated on the same die as the second inductor, resulting in a voltage waveform that is directly proportional to the magnitude of the AC current passing through the slug.

Figure 1:
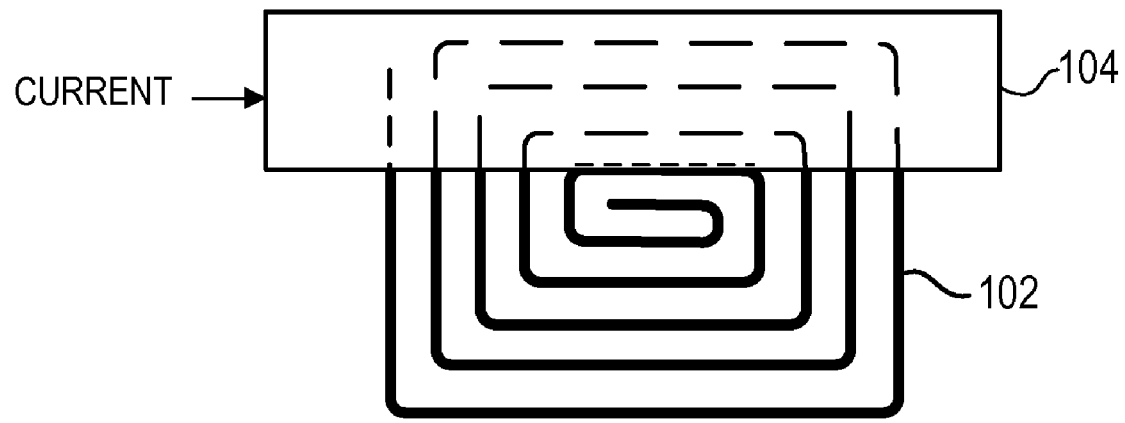
FIG. 1 illustrates a coil in close proximity with a current carrying conductor, illustrating operation of an embodiment of the present invention.

For example, FIG. 1 illustrates a coil or inductor 102 in close proximity with a large current carrying conductor (or slug) 104, such that the coil 102 and conductor 104 act as coupled inductors. The coupled inductors, along with on-chip electronics, which will be discussed herein below, allow for the creation of a $V_{SENSE}$ signal which is proportional to an input current. The current provided through the conductor 104 may be up to, for example, 10 A to 20 A. Other embodiments may provide for more or less current carrying capability through the conductor. The coil 102 is placed near the conductor 104 in order to create inductive coupling between the conductor 104 and coil 102.

Figure 2:
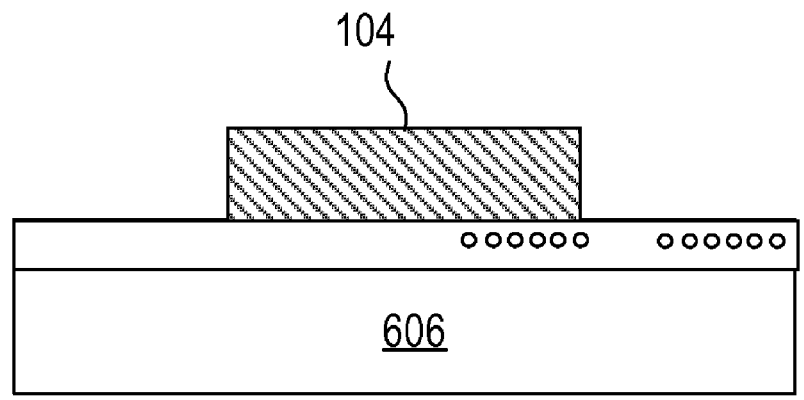
FIG. 2 is a cross-sectional view of an embodiment of a current sensor incorporating a coil in an integrated circuit die in close proximity with a current carrying conductor in the package.

There are multiple ways for implementing the coupled inductor configuration within a chip package. An exemplary embodiment is illustrated in FIG. 2. The inductor 102 may be formed in a metal layer of a die 606. The conductor or metal slug 104 may be formed on top of the die and comprise, for example, 15 μm of copper, or other suitable high conductivity material.

Figure 3:
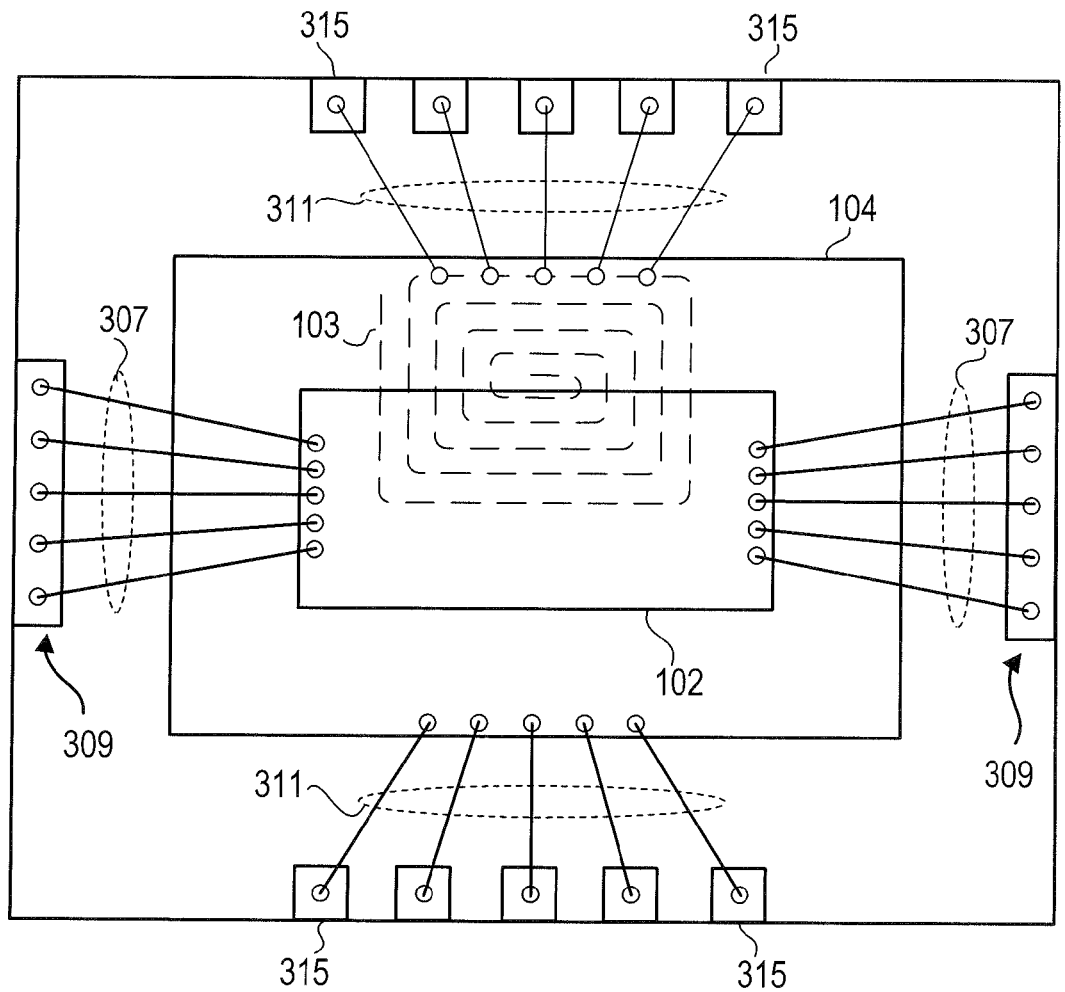
FIG. 3 is a top view of an embodiment of the current sensor shown in FIG. 2.

Referring now to FIG. 3, there is illustrated a top view of the exemplary package configuration shown in FIG. 2. The conductor 102 is disposed upon a silicon dioxide layer 104 of the die. The inductor 103 is located within the die and parallel to the conductor 102. Bond wires 307 connect the conductor 102 with external connectors, e.g., terminals 309. The bond wires 307 typically support a maximum current of 1-2 amps, thus multiple bond wires are required to be connected to the conductor 102 for higher currents. Additional bond wires 311 connect portions of the die to external terminals 315 for power, ground, and logic connections. Using the above-described package configuration, a 10 A-20 A sensor may be constructed. Various other embodiments of a suitable current sensor are illustrated in U.S. Publication No. 2007-0139835, published Jun. 21, 2007, entitled "Current Sensor with Reset Circuit," naming inventors Donald E. Alfano and Timothy J. Dupuis; U.S. Publication No. 2007-0139066, published Jun. 21, 2007, entitled "Integrated Current Sensor Package," naming inventors Timothy J. Dupuis and John Pavelka; and U.S. Publication No. 2007-0139032, published Jun. 21, 2007, entitled "Integrated Current Sensor," and naming inventors Timothy J. Dupuis and John Pavelka, which are incorporated herein by reference in their entirety.

Figure 4:
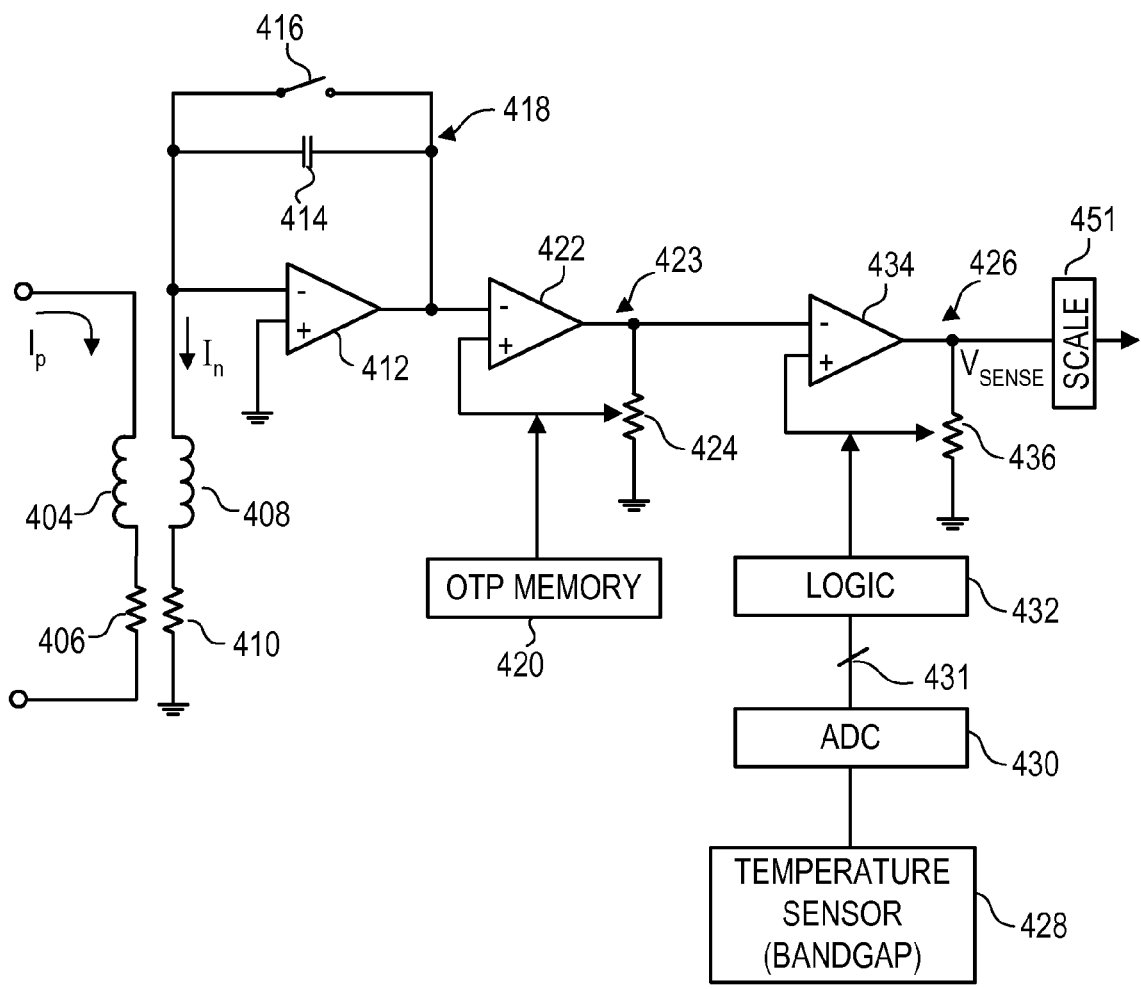
FIG. 4 illustrates a high-level circuit representation of a current sensor that may be utilized in an embodiment of the invention.

Exemplary on-chip electronics that may be utilized in the current sensor are shown in FIG. 4. FIG. 4 illustrates an exemplary embodiment for creating the $V_{SENSE}$ signal when detecting the current $i_p$ using the coupled inductors as illustrated, e.g., in FIG. 2. The primary side of the coupled inductor is shown as 404 in series with resistor 406. The secondary side is modeled by inductor 408 which is connected to a resistor 410. The resistor 410 is then connected to ground. The other side of inductor 408, which is connected to the negative (inverting) input of an operational amplifier 412, outputs an induced current $I_n$. The positive (non-inverting) input of operational amplifier 412 is connected to ground.

The current through the secondary side is dominated by the resistive loss of resistor 410 and is the derivative of the primary current. An integrator circuit 418 is used to integrate the induced current $I_n$. The integrator circuit 418 includes the operational amplifier 412, a capacitor 414 and a reset switch 416 in parallel with the capacitor 414. Thus, the current $I_n$ may be determined according to the equation:

$$I_n = (L_m/R_1)(di_p/dt)$$

By integrating on the capacitor 414 an output voltage, $V_{SENSE}$ is attained according to the following equation:

$$V_{SENSE} = 1/C \int I_n dt = (L_m/R_1 C)i_p$$

In this case, $L_m$, the mutual inductance, is well controlled, but can vary from part to part due to assembly variations. The capacitance C will vary from part to part and probably can be controlled to ±5% accuracy. The capacitor 414 will generally not have any appreciable temperature coefficient. The resistance $R_1$ is dominated by the metal resistance of the coil and will vary from part to part and is equal to the value of the resistor 410 and also has a large temperature coefficient.

In order to obtain overall accuracy for the capacitance C, which varies from part to part, factory calibration using a one-time programmable (OTP) memory 420 can be used. In a preferred embodiment, a low cost 42-bit OTP memory may be utilized. The OTP memory 420 provides a control variable to a programmable gain amplifier 422. The first gain stage 423, consisting of programmable amplifier 422, programmable resistance 424 and the OTP memory 420, compensates for part-to-part variations of the circuit. The OTP memory 420 is programmed at the factory based upon measurements made there. The programmable gain amplifier 422 has its negative input connected to the output of the operational amplifier 412. A programmable resistance 424 is connected between the output of the programmable amplifier 422 and ground. The positive input of programmable amplifier 422 is connected to the programmable resistance 424. The value of the programmable resistance 424, and thus the gain of the first gain stage 423, is controlled by the values provided from the OTP memory 420.

A second gain stage 426 compensates for differences in the resistance caused by temperature variations in the device. A temperature sensor 428 and an analog-to-digital converter (ADC) 430 are used to generate a digital temperature value to compensate for the coil resistance temperature coefficient. The temperature sensor 428 detects the temperature and generates an analog representation of the temperature. The ADC 430 converts the analog signal into a digital signal. The digital temperature value is provided, via a control bus 431, to control logic 432. In one embodiment, the control logic 432 may consist of a look-up table. The look-up table may include various control values associated with particular temperature values. Alternative embodiments may include a microprocessor programmed to control the output according to various temperature levels or other types of digital logic. The control logic 432 provides a control value to the programmable gain amplifier 434 and programmable resistance 436. The negative input of the amplifier 434 is connected to the output of programmable amplifier 422. The programmable resistor 436 is connected between the output of programmable amplifier 434 and ground. The positive input of the amplifier 434 is connected to the programmable resistance 436. The particular value of the programmable resistance 436, and thus the gain of the second gain stage 426, is controlled via the output from the control logic 432. The output of the amplifier 434 provides the compensated $V_{SENSE}$ signal. The code provided by the control logic 432 is updated during the phase in which the operational amplifier 412 is reset responsive to a reset signal applied to switch 416. The reset signal is applied while the sensed current $i_p$ is zero.

Using techniques and materials described above, it is possible to build a current sensor that can safely measure up to a maximum of about 20 A. However, there are many volume applications, such as motor controllers and high-output Uninterruptible Power Supply (UPS) systems, that require full-scale ranges of 100 A or more. One factor that limits the current full-scale value is the equivalent series resistance of the conductor or slug (404). It is this resistance that generates power losses, resulting in excessively high package temperatures. One way to achieve higher full-scale values is to use lower resistance materials for the slug, or modify the package for better heat dissipation, or both. However, those approaches increase cost and possibly package size.

Figure 5:
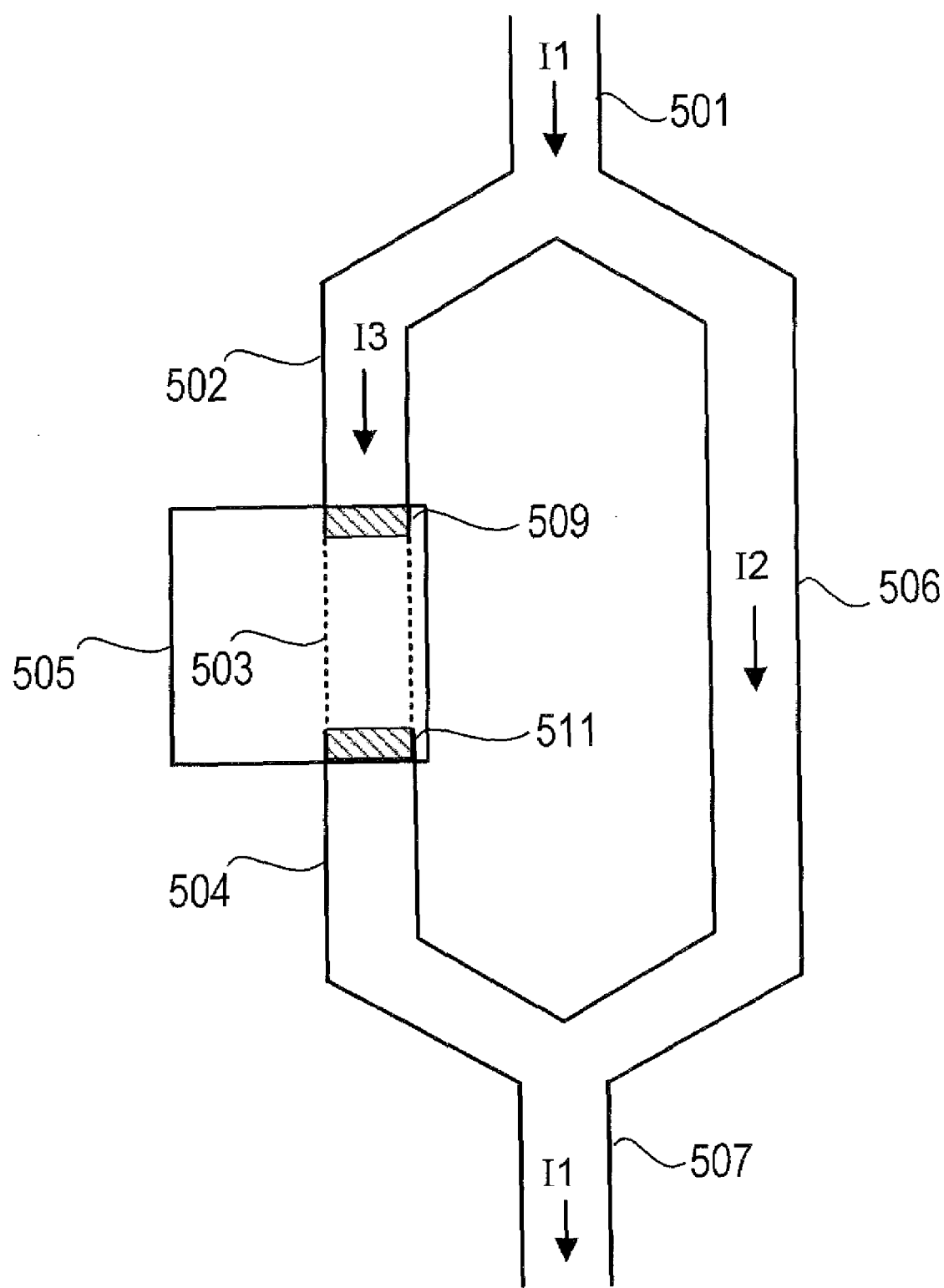
FIG. 5 illustrates a way to extend the full-scale range of the current sensor using a board layout that divides current.

Another way to extend the full-scale range of the current sensor is to design a board layout that divides current according to Kirchoff's current law, as shown in FIG. 5. As shown, a current divider is formed in the printed circuit board (PCB) traces such that a portion I3 of total current I1 flowing in trace 501 flows through PCB trace branch 502 and the current sensor conductor 503. The other portion I2 of the divided current flows in trace 506 and subsequently rejoins I3 to again reform I1 in trace 507. As an example, the current sensor 505 would be able to measure an I1 current of 100 A (have a full-scale range of 100 A) if installed in a 4:1 current divider similar to FIG. 1 by actually measuring only the 20 A portion of the divided current. The current I3 flows into the current sensor conductor at pad 509 and back into the PCB board trace 504 at pad 511. While this implementation is theoretically sound, it has the disadvantage of added parasitic inductance that can result in excessive ringing, thereby decreasing measurement accuracy. In addition, the accuracy of the current divider may be affected by mismatches in the PC board resistance and the resistance of the package slug and solder connection.

Figure 6:
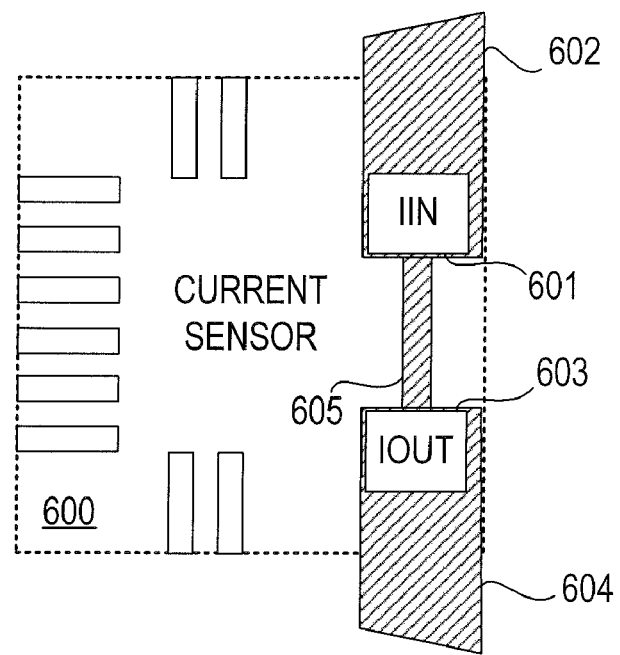
FIG. 6 illustrates a way to extend the full-scale range of the current sensor using a shorting bar between package terminals of the current sensor conductor to reduce the amount of current being measured by the current sensor according to an embodiment of the invention.

Referring to FIG. 6, in an embodiment of the invention, the input and output current measurement terminals 601 and 603 of the current sensor 600 (see terminals 309 in FIG. 3) are directly shorted with a PCB trace ("shorting bar") 605 connecting traces 602 and 604. The shorting bar 605 diverts a portion of the current around the internal current sensor conductor (not shown in FIG. 6) thereby extending the full-scale measurement range of the current sensor. The dimensions of the shorting bar 605 with respect to the conductor or slug determines the current division ratio. For example, the divider ratio is determined by the width and/or depth of the shorting bar as compared to the dimensions of the slug. Use of the shorting bar adds negligible inductance to the current sensing path, reduces ringing and maintains measurement accuracy, thus providing an improvement over the current divider approach shown in FIG. 5. Note that part-to-part difference may result from PCB and package resistance mismatches due to variations in parasitic inductances, capacitances, and resistances from PCB to PCB. In an exemplary embodiment, a 1 mm shorting bar allows a current sensor rated for 20 A to have a full-scale range of 34 A. That is, the current before it is divided may be 34 A. In an embodiment, a 5 mm wide trace forming the shorting bar extends the 20 A full-scale range to 100 A. The exact ratio of the current divider depends on the particular application and the capability of the current sensor.

Figure 7:
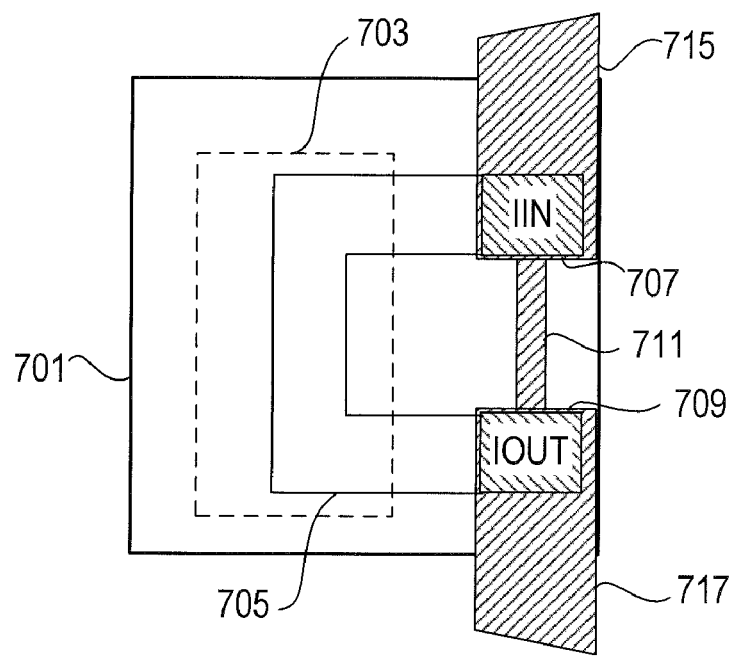
FIG. 7 illustrates another view of an embodiment of the invention.

FIG. 7 illustrates another view of the embodiment shown in FIG. 6. The current sensor includes an integrated circuit die 703 having the electronic components such as those shown in FIG. 4 along with the coil in which a voltage is induced by the current in slug 705. The integrated circuit die is mounted in a package shown generally as 701. A number of different package configurations are possible, e.g., lead frame embodiments, which are described in additional detail in the publications previously incorporated by reference. The package includes internal conductor (or slug) 705 in which the measured current flows. Slug 705 is coupled to an input pad 707 and an output pad 709. A shorting bar 711 formed as a PCB trace connects the PCB traces 715 and 717 and shorts to the input pad 707 to the output pad 709. Note that the slug may be connected to multiple terminals used for the input and output connections of the current to be measured as shown in FIG. 3. The shorting bar 711 may be connected to one or more input and one or more output terminals. The shorting bar 711 and slug 705 form a current divider to divide the current flowing in trace 715 into two smaller currents, which then recombine into the whole current in trace 717 after a portion flows through the slug and a portion of the current flows through the shorting bar. In a preferred embodiment, the shorting bar and slug are formed of substantially the same conductive material such as copper (or a copper alloy) to ensure that the current division remains constant through temperature variations to which the current sensor slug and PCB shorting bar are subject. That helps ensure that the temperature compensation shown in FIG. 4 will be effective. Note also that a scale factor may be used in the current sensor to reflect the current division ratio being employed. Thus, if the current division ratio is 3:1 and 20 A is sensed by the current sensor, a scale factor of 4 can be used in the current sensor in a scale circuit 451 (see FIG. 4) (e.g., a simple shift circuit or a more complex multiplication circuit) to adjust the sensed current to an amount that reflects the undivided current. Alternatively, or in conjunction with the scale, the gain of the amplifier 422 may be adjusted to reflect the current division. The OTP memory 420 may be used to control the scale logic 451. The control system coupled to receive the current sensor output may do the scaling itself rather than relying on the current sensor to implement the scaling.

Note that while a particular current sensor configuration has been shown, e.g., in FIG. 4, any number of other types of current sensors may work including, for example, Hall sensors.

Thus, various embodiments have been described for expanding the current measurement capabilities of a current sensor. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. An apparatus comprises:
   a printed circuit board (PCB);
   a current sensor coupled to the printed circuit board, the current sensor including a first conductor portion to carry a first current to be measured by the current sensor;
   a second conductor portion to carry a second current;
   wherein the first conductor portion and the second conductor portion form a current divider to divide a third current;
   wherein the current sensor includes one or more input terminals to receive the first current from the PCB and one or more output terminals to supply the first current to the PCB; and
   wherein the second conductor is directly electrically connected to at least one of the one or more input terminals and at least one of the one or more output terminals.

2. The apparatus as recited in claim 1, wherein the third current is larger than the first current.

3. The apparatus as recited in claim 1, wherein the first current is from about 1 to about 20 A.

4. The apparatus as recited in claim 1, wherein the second conductor portion is a conductive trace on the printed circuit board.

5. The apparatus as recited in claim 1, wherein the first and second conductor portions are formed of a substantially similar conductive material.

6. The apparatus as recited in claim 5, wherein the first and second conductor portions are formed substantially of copper.

7. The apparatus as recited in claim 1 wherein the first and second currents combine into the third current of from about 30 A to about 100 A.

8. The apparatus as recited in claim 1 wherein the current sensor includes a package in which the first conductor portion is formed.

9. A method for measuring a current comprising:
   dividing a first current in a current divider formed by a first conductor of a current sensor and a second conductor of a printed circuit board, the second conductor being directly connected to at least one input terminal of the current sensor and at least one output terminal of the current sensor, the dividing forming a second and third current, the first conductor receiving the second current from the at least one input terminal and supplying the second current to the at least one output terminal of the current sensor, the second conductor receiving the third current; and
   measuring in the current sensor, the second current in the first conductor.

10. The method as recited in claim 9 further comprising adjusting the measured current to reflect the current divider.

11. The method as recited in claim 9, wherein the first current is larger than the second current by at least about 60 percent.

12. The method as recited in claim 9, wherein the second current is from about 1 to about 20 A.

13. The method as recited in claim 9 wherein the first current is from about 30 A to about 100 A.

14. The method as recited in claim 9 further comprising reforming the first current by combining the second current flowing in the first conductor between the at least one input and the at least one output terminal with the third current flowing in the second conductor between the at least one input terminal and the at least one output terminal, the combining occurring where the output terminal is directly connected to the second conductor.

15. An apparatus comprising:
a current divider formed by a first conductor in a package of a current sensor and a second conductor on a printed circuit board that electrically shorts at least one input terminal of the current sensor to at least one output terminal of the current sensor, the second conductor being directly electrically connected to the at least one input terminal and the at least one output terminal;
wherein the at least one input terminal of the current sensor is coupled to supply current to be measured to the first conductor and the at least one output terminal is coupled to supply the measured current to the printed circuit board.

16. The apparatus as recited in claim 15 wherein the current sensor further comprises:
an integrated circuit die; and
the package in which the first conductor is formed adjacent to the integrated circuit die.

17. The apparatus as recited in claim 15, wherein the first and second conductors are formed of a substantially similar conductive material.

18. The apparatus as recited in claim 15, wherein the first and second conductors are formed substantially of copper.

* * * * *